United States Patent
Goruganthu et al.

(10) Patent No.: US 6,352,871 B1
(45) Date of Patent: Mar. 5, 2002

(54) PROBE GRID FOR INTEGRATED CIRCUIT EXCITATION

(75) Inventors: Rama R. Goruganthu; Jeffrey D. Birdsley; Michael R. Bruce; Brennan V. Davis; Rosalinda M. Ring, all of Austin; Glen Gilfeather, Del Valle, all of TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/409,089

(22) Filed: Sep. 30, 1999

(51) Int. Cl.[7] .............................................. H01L 21/66
(52) U.S. Cl. ........................................ 438/18; 324/754
(58) Field of Search ............................ 438/18; 324/754

(56) References Cited

U.S. PATENT DOCUMENTS

| 5,523,252 A | * | 6/1996 | Saito | 438/18 |
| 6,040,706 A | * | 3/2000 | Tsuura | 324/765 |
| 6,130,104 A | * | 10/2000 | Yamasaka | 438/14 |

* cited by examiner

Primary Examiner—T. N. Quach

(57) ABSTRACT

The ability to excite virtually any portion of semiconductor device is enhanced via a grid formed for exciting circuitry in the semiconductor device. According to an example embodiment of the present invention, a grid having a plurality of narrow probe points is formed extending over target circuitry in a semiconductor device. The grid is accessed and used for exciting various target circuitry within the device by exciting the part of the grid that corresponds to the portion of the target circuitry to which access is desired.

30 Claims, 5 Drawing Sheets

PROBE GRID FOR INTEGRATED CIRCUIT EXCITATION

FIELD OF THE INVENTION

The present invention relates generally to semiconductor devices, and more particularly, to techniques for analyzing and debugging circuitry within an integrated circuit device.

BACKGROUND OF THE INVENTION

The semiconductor industry has recently experienced technological advances that have permitted dramatic increases in circuit density and complexity, and equally dramatic decreases in power consumption and package sizes. Present semiconductor technology now permits single-chip microprocessors with many millions of transistors, operating at speeds of hundreds of millions of instructions per second to be packaged in relatively small, air-cooled semiconductor device packages. A by-product of such high-density and high functionality in semiconductor devices has been the demand for increased numbers of external electrical connections to be present on the exterior of the die and on the exterior of the semiconductor packages which receive the die, for connecting the packaged device to external systems, such as a printed circuit board.

As the manufacturing processes for semiconductor devices and integrated circuits increase in difficulty, methods for testing and debugging these devices become increasingly important. Not only is it important to ensure that individual chips are functional, it is also important to ensure that batches of chips perform consistently. In addition, the ability to detect a defective manufacturing process early is helpful for reducing the number of defective devices manufactured.

Traditionally, integrated circuits have been excited for testing using methods including powering the device via external contacts, or directly accessing circuitry or devices within the integrated circuit. External contacts on integrated circuit devices can and have been used for powering the device for analysis, however, using such external contacts is limited because individual excitation of portions of circuitry within the device is difficult. Directly accessing and exciting the circuitry is useful for stimulating individual portions of circuitry within the device, but is difficult for several reasons. For instance, existing methods do not readily facilitate access to various portions of an integrated circuit simultaneously. In addition, the close proximity of circuitry and devices, particularly as the device sizes decrease and circuit density increases with advancing technology, make it difficult to excite portions of densely populated circuit areas.

One type of integrated circuit device for which exciting various portions of the circuit is difficult is the flip-chip type device. In flip-chips, transistors and other circuitry are located in a very thin epitaxially-grown silicon layer in a circuit side of the die. The circuit side of the die is arranged face-down on a package substrate. This orientation provides many operational advantages. However, due to the face-down orientation of the circuit side of the die, the transistors and other circuitry near the circuit side are not readily accessible for testing, modification, or other purposes. Therefore, access to the transistors and circuitry near the circuit side is from the back side of the chip. Since access to the transistors and circuitry in flip-chips is generally from the back side of the chip, it is often necessary to mill through the back side and probe certain circuit elements in order to excite the device. Maintaining accuracy while milling to the circuitry in the die is difficult and time-consuming.

Often, the area between transistors and other circuitry in flip-chips and other integrated circuit devices is very small. Providing power and exciting portions of the device between such circuitry and devices is difficult to achieve without contacting the devices between which the probes are formed and potentially causing damage. In addition, typical probes are not small enough to enable the addition of a plurality of such probes in relatively small spaces. These and other difficulties inhibit the excitation of devices located in various portions of a semiconductor die. A related inhibition to the analysis of semiconductor devices is the lack of a readily usable manner in which to excite circuitry in locations throughout the device. This problem continually worsens as the amount of circuitry within a typical semiconductor device number into the millions and are formed at distances between each other ranging in the micron or sub-micron level.

SUMMARY OF THE INVENTION

The present invention is directed to a method and system for forming a grid in a semiconductor device for improving analysis of the device involving using the grid to excite various portions of the circuitry. The present invention is exemplified in a number of implementations and applications, some of which are summarized below.

According to an example embodiment of the present invention, a grid having several elongated narrow conductive via probes is formed in a semiconductor device having circuitry in a circuit side opposite a back side. The grid is created by forming a plurality of probe points extending over target circuitry in the semiconductor device. A target node in the circuitry is excited by exciting part of the grid coupled to the target node.

According to another example embodiment of the present invention, a system is arranged for analyzing a semiconductor device having circuitry in a circuit side opposite a back side. The system includes a substrate removal device adapted to remove substrate from the semiconductor device and form an exposed region over a target node. An ion deposition device is also included and is adapted to form a grid having a plurality of probe points extending over the target node. A testing arrangement is adapted to use the grid and to excite the device.

The above summary of the present invention is not intended to describe each illustrated embodiment or every implementation of the present invention. The figures and detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
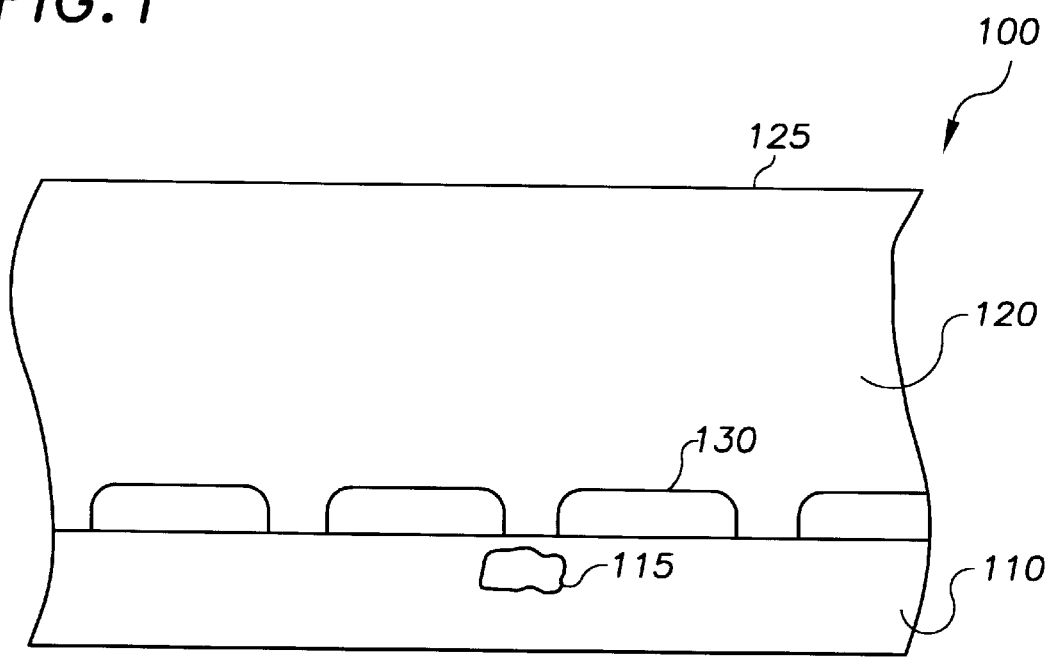
FIG. 1 is a semiconductor device for use in connection with an example embodiment of the present invention.
Figure 2:
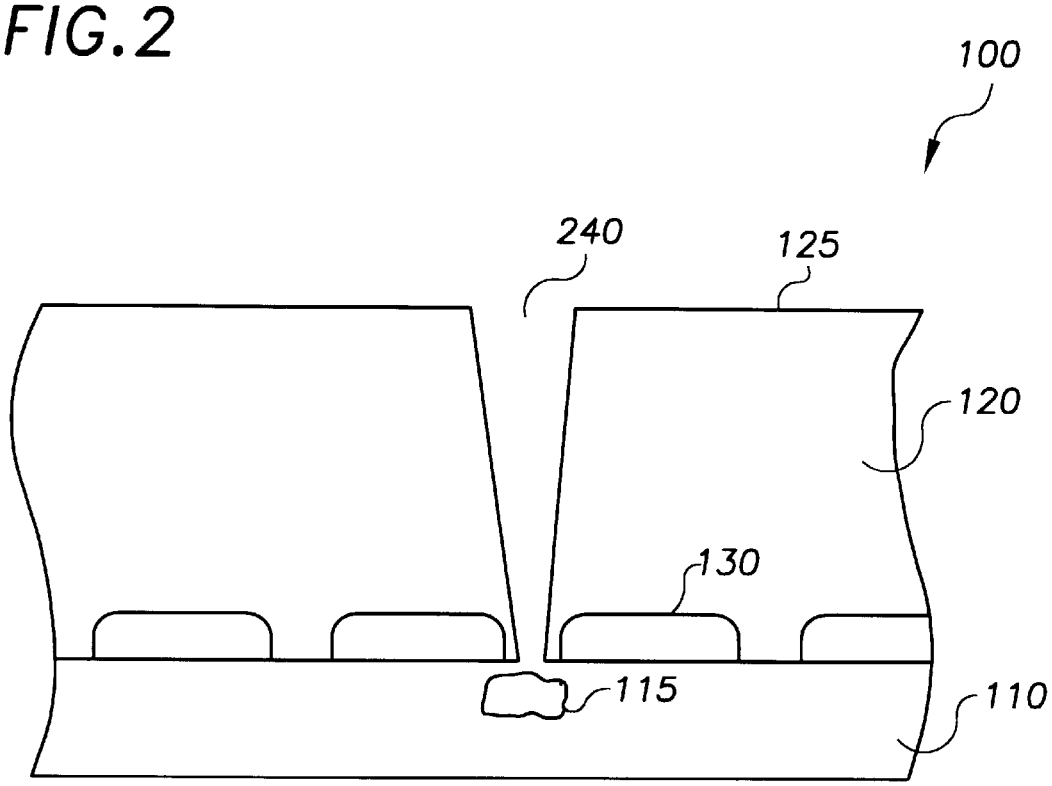
FIG. 2 is the semiconductor device of FIG. 1 having undergone a processing step, according to an example embodiment of the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

The present invention is believed to be applicable to a variety of different types of semiconductor devices, and the invention has been found to be particularly suited for flip-chip and other type devices requiring or benefiting from analysis involving exciting circuitry within the device. While the present invention is not necessarily limited to such devices and analysis, various aspects of the invention may be appreciated through a discussion of various examples using this context.

According to an example embodiment of the present invention, a grid having elongated probes is formed over target circuitry in a semiconductor device. Using the grid, various portions of the target circuitry are easily accessed for exciting the device. For example, in addition to exciting a particular target portion of the device, the grid can be used to access and excite several areas of the device at once. Exciting several areas at once is particularly useful for comparing different regions of the device and searching for defects, such as short circuits that generate heat. In addition, using elongated probes to form the grid allows access for exciting target circuitry formed in close proximity, such as between closely-spaced transistors or in buried layers of circuitry in semiconductor die. Furthermore, using elongated probes to form the grid allows close placement of the probes to form a dense grid useful for exciting virtually any portion of closely-spaced circuitry without short-circuiting between the probes or damaging the circuitry. The use of the grid in this manner improves the ability to excite a semiconductor device, such as by applying an electrical signal, heat, or a magnetic field.

Figure 3:
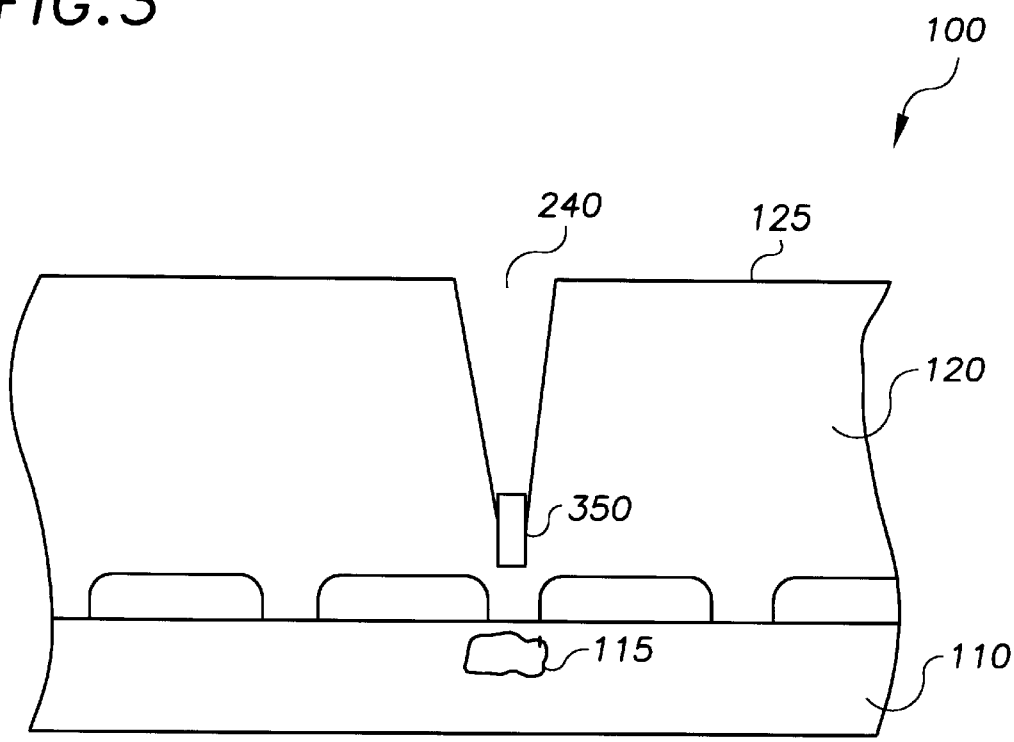
FIG. 3 is the semiconductor device of FIG. 2 having undergone another processing step, according to another example embodiment of the present invention.
Figure 4:
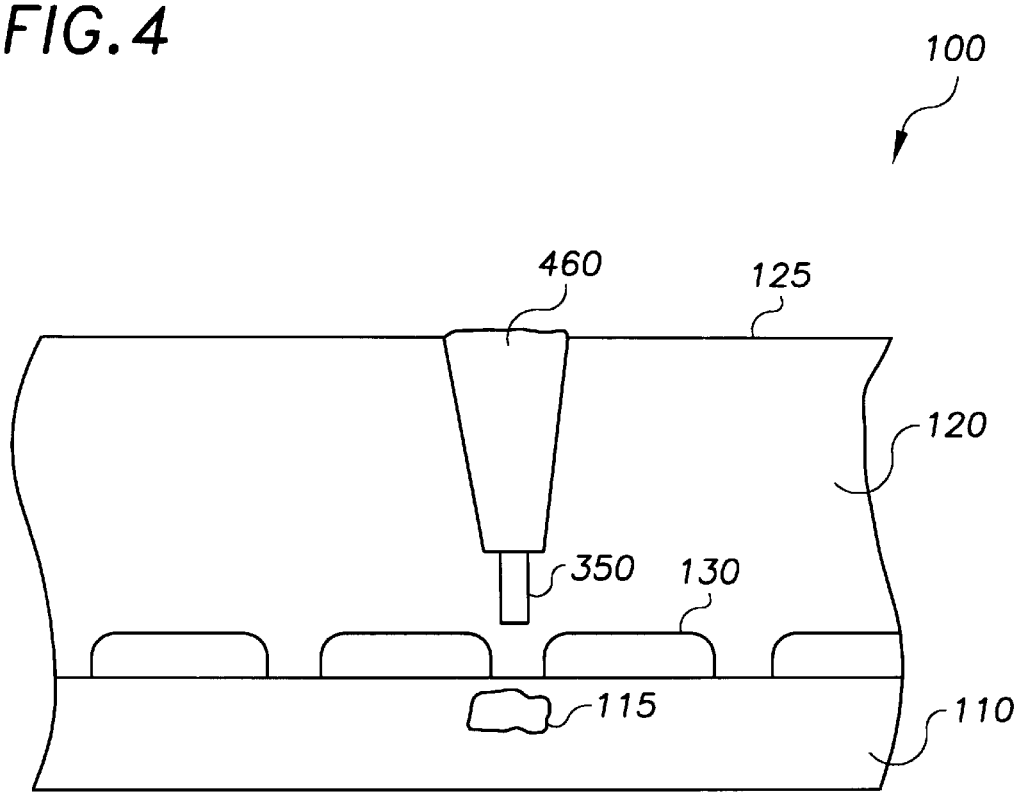
FIG. 4 is the semiconductor device of FIG. 3, having undergone another processing step, according to an example embodiment of the present invention.
Figure 5:
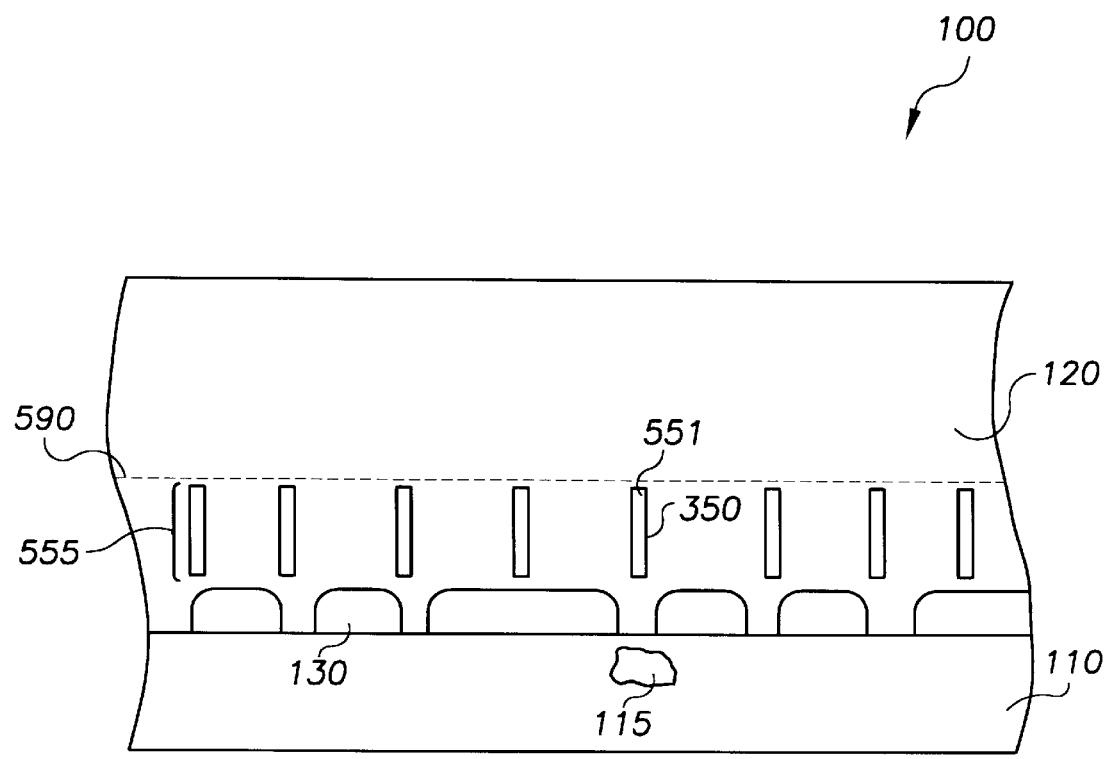
FIG. 5 is another semiconductor device having a plurality of probe points forming a grid, according to another example embodiment of the present invention.

The grid can be formed in various manners. For instance, FIGS. 1–4 show steps in the formation of an elongated conductive probe, and FIG. 5 shows several such probes forming a portion of the grid, according to an example embodiment of the present invention. In FIG. 1, a semiconductor device 100 for use in connection with the present invention has target circuitry 115 in a circuit side 110 opposite a back side 120, and elements 130 formed within the device. Substrate is removed from the semiconductor device 100 at a back side surface 125 in FIG. 2, and an exposed region 240 is formed over the target circuitry 115. The substrate can be removed, for example, using a FIB or other ion bombardment device, a laser etching device, chemical mechanical polishing, or a combination thereof. In FIG. 3, an insulated conductor 350 is formed in the exposed region 240 using, for example, Gallium ion implantation. In one implementation, the substrate removal and the formation of the insulated conductor are performed with the same FIB device.

In another example embodiment of the present invention, the probe is formed by first forming an insulating layer around the walls of the exposed region 240 and depositing conductive material inside the insulating layer. One particular method of forming the conductor includes depositing an insulating material having a conductive core in the exposed region in a single step. This method facilitates the formation of very narrow, sub-micron width probes by forming an exposed region having an aspect ratio of at least about 4. For a more detailed explanation of forming such a conductor, reference may be made to co-pending patent application Ser. No. 09/383,790, Ring et al., filed on Aug. 26, 1999, entitled "ARRANGEMENT AND METHOD FOR CHARACTERIZATION OF FIB INSULATOR DEPOSITION" which is assigned to the assignee of the present invention and is incorporated herein by reference. In this manner, the conductor can be deposited using one process for creating both a conductive insulator core and a non-conductive insulator around the core. In addition, the conductor can be deposited using an FIB that is also used to form the exposed region.

The insulated conductor 350 of FIG. 3 is shown extending from a location over the target circuitry 115. Alternatively, the insulated conductor 350 can be located closer to the target circuitry and between the elements 130. The insulated conductor 350 is one of a plurality of conductors that form a grid. In one implementation, the grid is formed in a 5×5 micrometer trench. Other implementations involve forming the grid over most of the target circuitry, or most of the semiconductor device.

FIG. 5 shows a grid portion 555 having probe points 350. The grid is used to excite the target circuitry 115 or other devices 130, using methods such as direct coupling and capacitive coupling, and using devices such as a power source, a laser source, an ion bombardment device, or a heat source. Using these methods, magnetic fields, heat, and electric signals can be used to excite the target circuitry. In addition, various types of circuitry or devices can be excited in this manner, such as source, gate, or drain regions, metal interconnects, transistors, or other devices typically used in semiconductor devices. Capacitive coupling is particularly useful because the device can be excited without necessarily altering or otherwise damaging the circuitry due to the addition of the conductor to the circuit. One method for capacitively coupling includes forming the grid at about 3 microns over and away from the target circuitry.

Connection to the conductor 350 for analysis can be made in several manners. For instance, one example method for connecting to the insulated conductor 350 is shown in FIG. 4, where conductive material, such as probe 460, has been deposited in the exposed region 240 above the insulated conductor 350. Connection is then made via the deposited conductive material 460. In another implementation, not shown in FIG. 4, the insulated conductor 350 extends through the back side and to the back side surface 125, and connection is made at the back side surface. In still another implementation, and referring to FIG. 5, after the grid is formed the portion over the probe in the exposed region 240 is filled with silicon substrate. When access to the probe is desired, the substrate is removed to the dashed line 590 and access is made directly to the end 551 of the probe. The substrate removal can be accomplished using various processes. For example, chemical-mechanical polishing can be used to globally thin the back side 120 and expose some or all of the entire grid 555. Local thinning methods, including using devices such as a FIB or a laser etching device, can also be used to expose a portion of the grid 555.

In addition to back-side probe formation and access as shown in FIGS. 1–4, probes are formed and accessed in other manners in other example implementations of the present invention. For instance, probes can be formed via the circuit side 110, and access to the resulting grid can be via either side as applications vary. The probes can be formed as shown in the back side, in the circuit side, or in both sides. In addition, the probes can be formed during the manufacture of the device, or formed after some or all of the device has been made, such as shown in FIGS. 1–4. When the probes are formed during the manufacture of the device, the resulting grid may be used for exciting circuitry before or after the manufacture of the device is complete.

In another particular application, the probe grid is formed during manufacture of the device and extends into the back side, such as shown in FIG. 3. The grid can be accessed for exciting the device while the device is being manufactured. In an alternate implementation, substrate is re-formed in the exposed region 240, and the manufacturing process is completed. When access to the grid is desired for exciting target circuitry for post-manufacturing analysis, substrate is removed to expose a portion of the grid having one or more probes and the target region is accessed via the exposed probe(s). In another particular application, the probes are formed via the circuit side as the die is manufactured and without removing substrate via the back side surface 125. Again, when access for exciting the target circuitry is desired, the grid is accessed by removing substrate and exposing one or more probes.

Figure 6:
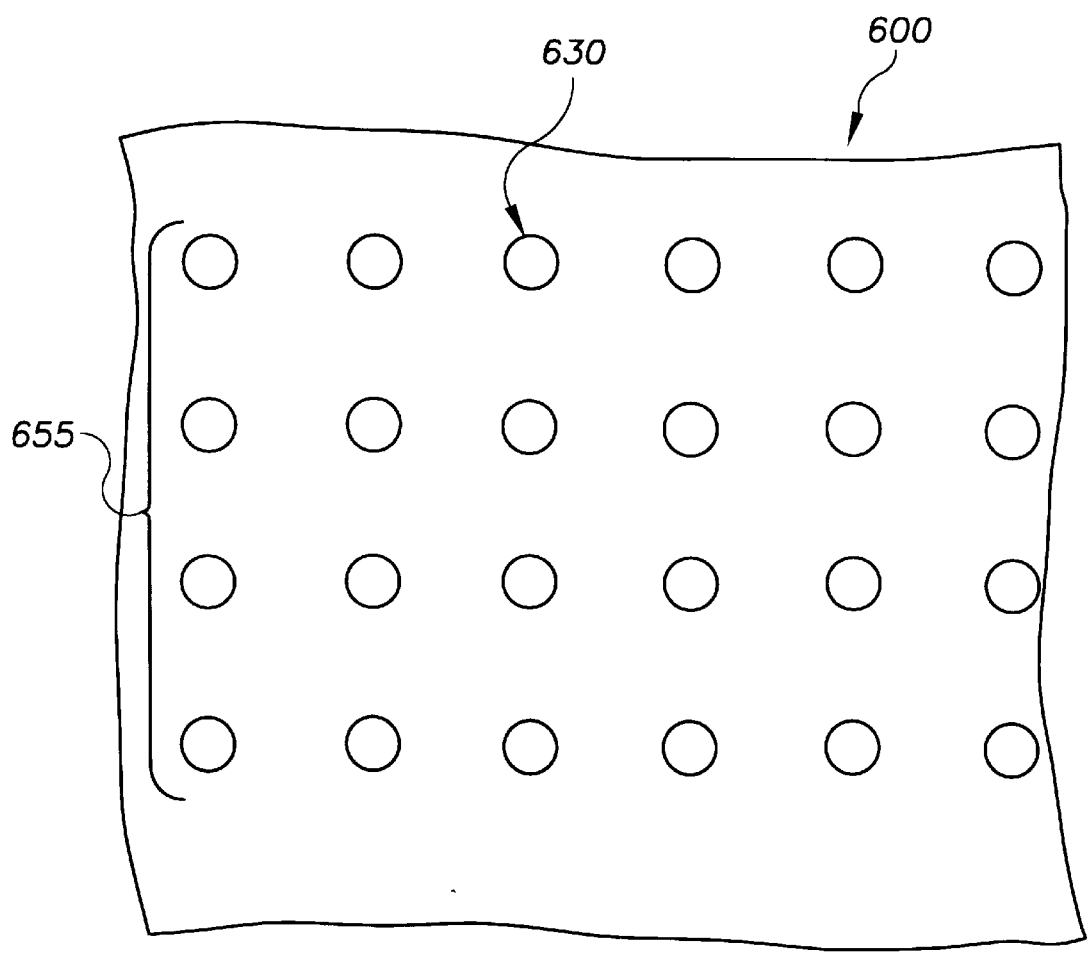
FIG. 6 is top view of another semiconductor device, such as shown in FIG. 5, having a plurality of probe points forming a grid, according to another example embodiment of the present invention.

FIG. 6 is a top view of a portion of a semiconductor device 600, according to another example embodiment of the present invention. Grid portion 655 is formed from an array of probes 630. Although FIG. 6 shows the grid portion 655 having proportionally-spaced probes 630, the grid may be formed having a variety of spatial probe arrangements, and can be tailored to the particular type of semiconductor die or to achieve various desired excitation results.

Figure 7:
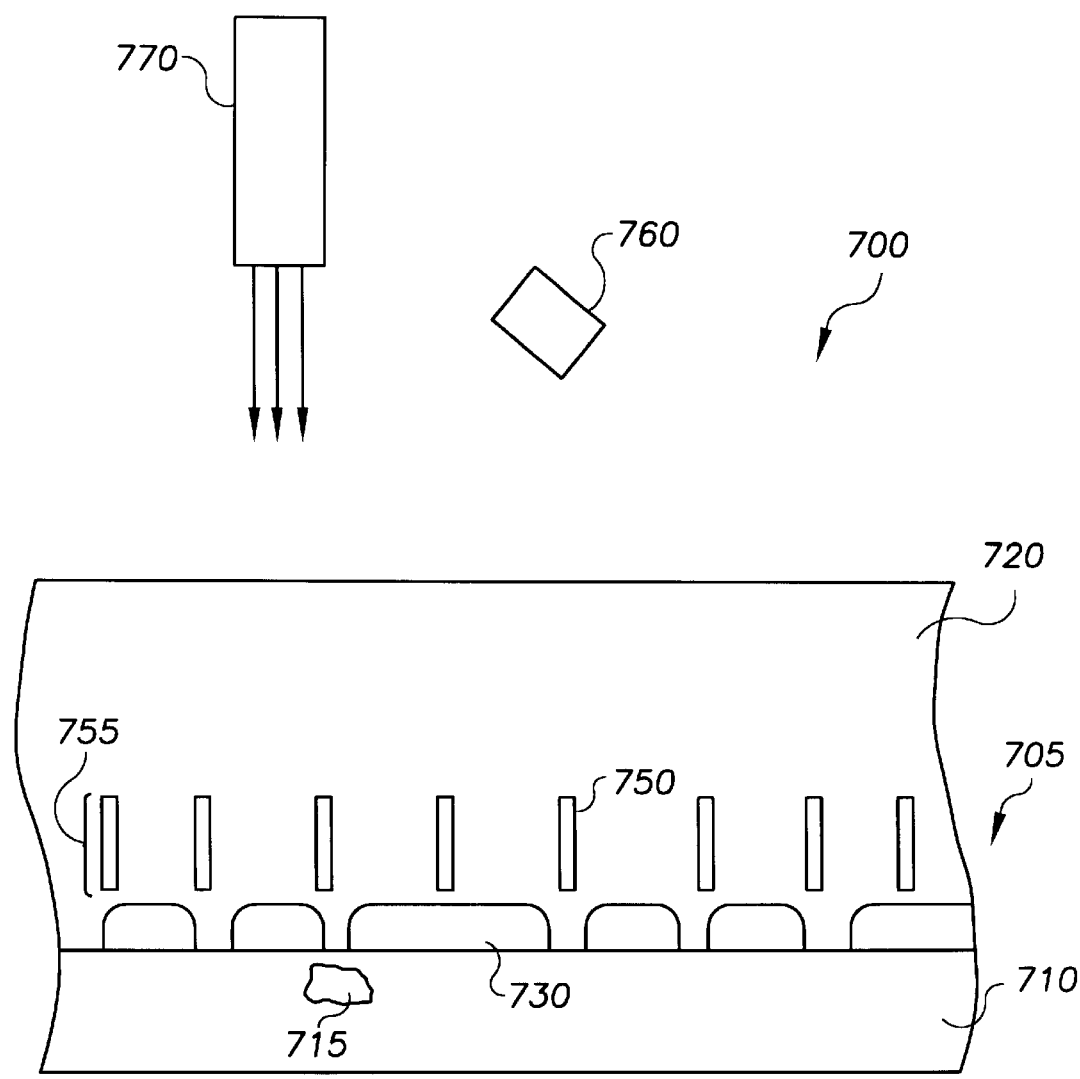
FIG. 7 is a system for analyzing a semiconductor device, according to another example embodiment of the present invention.

According to another example embodiment of the present invention, a system is arranged for analyzing a semiconductor device having circuitry in a circuit side opposite a back side. FIG. 7 shows one such example in system 700. FIB device 770 is used to form probes 750 making up a grid 755 in the back side 720 and over circuitry 715 and devices 730 in the circuit side 710 of the semiconductor device 705. FIB device 770 may also be used for removing substrate from the back side 720. Excitation device 760 is arranged to excite the device via the grid 755. For example, the excitation device 760 may include a power supply for powering a portion of the grid 750. In other implementations, a signal is supplied, such as by generating a waveform. A response to the excitation is detected and used for analyzing the device.

The system 700 may also be used in connection with other devices, such as a heat source, a test fixture, a computer, a laser, or a signal generating device. For example, a test fixture having the ability to hold and test the semiconductor device can be used for analyzing a semiconductor device having the grid 755. The test fixture includes excitation and measurement devices, such as a power source for supplying power to the device and a detection device for detecting the device response to the power source. For further information regarding test fixtures, reference may be made to U.S. patent application Ser. No. 09/247,002, filed on Feb. 8, 1999. The grid 755 can be use to supply power for exciting the device and/or to detect a response to the excitation. I/O pins coupled to circuitry within the device may also be used for exciting or detecting a response from the device in connection with excitation via the grid. Alternatively, the device can be tested without a test fixture, such as by powering the circuitry via the grid and imaging the device using IR microscopy. The image is used to determine the existence of defects in the device, such as short circuits.

While the present invention has been described with reference to several particular example embodiments, those skilled in the art will recognize that many changes may be made thereto without departing from the spirit and scope of the present invention, which is set forth in the following claims.

What is claimed is:

1. A method for analyzing a semiconductor device having circuitry in a circuit side opposite a back side, the method comprising:

removing substrate from the semiconductor device and forming an exposed region over a target node;

forming a grid having a plurality of probe points extending over target circuitry in the semiconductor device; and exciting the target circuitry by coupling energy to the target circuitry via at least one of the probe points.

2. The method of claim 1, wherein forming a grid having a plurality of probe points extending over target circuitry in the semiconductor device comprises:

(A) removing substrate from the semiconductor device and forming an exposed region over a target node;

(B) forming an insulated narrow conductor to form a probe point; and (C) repeating steps A and B until the grid is formed.

3. The method of claim 2, wherein forming an insulated narrow conductor to form a probe point comprises depositing a material in the exposed region over the target node and using the deposited material to form simultaneously a conductive core and an immediately adjacent insulator.

4. The method of claim 2, wherein removing substrate from the semiconductor device and forming an exposed region over a target node includes milling with an aspect ratio of at least 4.

5. The method of claim 1, wherein the grid is formed in a trench having a diameter of about 5 microns.

6. The method of claim 1, wherein forming a grid having a plurality of probe points extending over target circuitry in the semiconductor device includes forming the grid in the back side of the device.

7. The method of claim 6, wherein forming the grid includes forming the grid before the manufacture of the device is complete, and wherein exciting the target circuitry includes exciting the target circuitry for post-manufacturing analysis.

8. The method of claim 6, wherein forming the grid includes forming the grid before the manufacture of the device is complete, and wherein exciting the target circuitry includes exciting the target circuitry before the manufacture of the device is complete.

9. The method of claim 6, wherein forming the grid includes forming the grid after the manufacture of the device is complete, and wherein exciting the target circuitry includes exciting the target circuitry for post-manufacturing analysis.

10. The method of claim 6, wherein at least one of the plurality of probe points is formed extending through the back side.

11. The method of claim 1, wherein forming a grid having a plurality of probe points extending over target circuitry in the semiconductor device includes forming the grid in the circuit side of the device.

12. The method of claim 11, wherein forming the grid includes forming the grid before the manufacture of the device is complete, and wherein exciting the target circuitry includes exciting the target circuitry for post-manufacturing analysis.

13. The method of claim 11, wherein forming the grid includes forming the grid before the manufacture of the device is complete, and wherein exciting the target circuitry includes exciting the target circuitry before the manufacture of the device is complete.

14. The method of claim 11, wherein forming the grid includes forming the grid after the manufacture of the device is complete, and wherein exciting the target circuitry includes exciting the target circuitry for post-manufacturing analysis.

15. The method of claim 1, wherein the plurality of probe points are formed using a Gallium ion beam.

16. The method of claim 1, wherein forming a grid having a plurality of probe points includes forming a probe point having a width of between about 0.5 microns and 1 micron.

17. The method of claim 1, wherein forming a grid having a plurality of probe points includes forming a probe point that extends into an epi region of the device and is coupled to at least one of: a source, a drain, a gate, and a metal interconnect.

18. The method of claim 1, wherein forming a grid having a plurality of probe points extending over target circuitry in the semiconductor device includes forming probe points beginning at about 3 microns over the target circuitry.

19. The method of claim 1, wherein exciting the target circuitry by coupling energy to the target circuitry via at least one of the probe points includes capacitively coupling to the target circuitry.

20. The method of claim 1, wherein exciting the target circuitry by coupling energy to the target circuitry via at least one of the probe points includes exciting via at least one of: a magnetic field, an electric signal, and heat transfer.

21. The method of claim 1, wherein exciting the target circuitry by coupling energy to the target circuitry via at least one of the probe points includes exciting using at least one of: a power source, a laser source, an ion bombardment device, and a heat source.

22. The method of claim 1, wherein exciting the target circuitry by coupling energy to the target circuitry via at least one of the probe points comprises removing substrate from the semiconductor device and exposing the grid.

23. The method of claim 22, wherein exciting the target circuitry by coupling energy to the target circuitry via at least one of the probe points further comprises depositing conductive material on the exposed grid and using the deposited conductive material to excite the target circuitry.

24. The method of claim 1, wherein the target circuitry includes about all of the circuitry over which the grid is formed.

25. A system for analyzing a semiconductor device having circuitry in a circuit side opposite a back side, the system comprising:
   means for removing substrate from the semiconductor device and forming an exposed region over a target node;
   means for forming a grid having a plurality of probe points over the target node; and
   means for exciting target circuitry within the device by coupling energy to the target circuitry via at least one of the probe points.

26. A system for analyzing a semiconductor device having circuitry in a circuit side opposite a back side, the system comprising:
   a substrate removal device adapted to remove substrate from the semiconductor device and form an exposed region over a target node;
   an ion deposition device adapted to form a grid having a plurality of probe points over the target node; and
   a testing arrangement adapted to access the grid and excite target circuitry in the semiconductor device by coupling energy to the target circuitry via at least one of the probe points.

27. A system, according to claim 26, wherein the substrate removal device includes at least one of: a FIB device, a laser etching device, and a chemical-mechanical polishing device.

28. A system, according to claim 26, wherein the ion deposition device includes a FIB device.

29. A system, according to claim 26, wherein the substrate removal device and the ion deposition device are one and the same.

30. A system, according to claim 26, wherein the testing arrangement includes at least one of: a power supply, a heat supply, a laser, an ion bombardment device, a test fixture, and a computer.

* * * * *

UNITED STATES PATENT AND TRADEMARK OFFICE
CERTIFICATE OF CORRECTION

PATENT NO. : 6,352,871 B1
DATED : March 5, 2002
INVENTOR(S) : Goruganthu et al.

It is certified that error appears in the above-identified patent and that said Letters Patent is hereby corrected as shown below:

Column 6,
Line 43, "at least 4" should read -- at least about 4 --.

Signed and Sealed this

Third Day of September, 2002

Attest:

JAMES E. ROGAN
*Attesting Officer*     *Director of the United States Patent and Trademark Office*